(12) United States Patent
Kakutani et al.

(10) Patent No.: US 12,057,427 B2
(45) Date of Patent: Aug. 6, 2024

(54) WIRE BONDING APPARATUS

(71) Applicant: SHINKAWA LTD., Tokyo (JP)

(72) Inventors: Osamu Kakutani, Tokyo (JP); Shigeru Hayata, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 148 days.

(21) Appl. No.: 17/913,441

(22) PCT Filed: Feb. 22, 2021

(86) PCT No.: PCT/JP2021/006549
§ 371 (c)(1),
(2) Date: Sep. 22, 2022

(87) PCT Pub. No.: WO2022/176182
PCT Pub. Date: Aug. 25, 2022

(65) Prior Publication Data
US 2023/0125756 A1     Apr. 27, 2023

(51) Int. Cl.
*B23K 20/00*     (2006.01)
*B23K 20/10*     (2006.01)
(Continued)

(52) U.S. Cl.
CPC ............ *H01L 24/78* (2013.01); *B23K 20/004* (2013.01); *B23K 20/10* (2013.01);
(Continued)

(58) Field of Classification Search
CPC .......... H01L 24/78; H01L 2224/78353; H01L 2224/78822; H01L 2224/78824;
(Continued)

(56) References Cited

U.S. PATENT DOCUMENTS 3,941,294 A * 3/1976 Johannsmeier .......... B23Q 1/48
                                                   228/6.2
4,781,319 A * 11/1988 Deubzer .............. B23K 20/005
                                                   228/1.1
(Continued)

FOREIGN PATENT DOCUMENTS

CN        1551321 A * 12/2004 .......... B23K 20/004
CN     109923652 A * 6/2019 ............ H01L 24/44
(Continued)

OTHER PUBLICATIONS

"International Search Report (Form PCT/ISA/210) of PCT/JP2021/006549," mailed on May 18, 2021, with English translation thereof, pp. 1-4.
(Continued)

*Primary Examiner* — Kiley S Stoner
(74) *Attorney, Agent, or Firm* — JCIPRNET

(57) ABSTRACT

A wire bonding apparatus (100) includes a bonding stage (12), a bonding head (20), an XY driving mechanism (30), and a frame (50). The XY driving mechanism (30) includes: an X-direction guide (31) installed to the frame (50); an X-direction slider (32), supported by the X-direction guide (31) and moving in the X direction, an X-direction mover (41) being installed thereto; a Y-direction guide (33) installed to a lower side of the X-direction slider (32); and a Y-direction slider (34), supported by the Y-direction guide (33) and moving in the Y direction, the bonding head (20) being installed thereto. The XY driving mechanism (30) is installed to the frame (50), so that a portion of the Y-direction guide (33) is overlapped with a mounting surface (12a) of a bonding stage (12) above the mounting surface (12a) and behind the mounting stage (12) in the Y direction.

13 Claims, 9 Drawing Sheets

(51) Int. Cl.
*H01L 23/00* (2006.01)
*B23K 101/40* (2006.01)

(52) U.S. Cl.
CPC ... *B23K 2101/40* (2018.08); *H01L 2224/78353* (2013.01); *H01L 2224/78822* (2013.01); *H01L 2224/78824* (2013.01); *H01L 2924/40* (2013.01)

(58) Field of Classification Search
CPC ... H01L 2924/40; H01L 24/745; H01L 21/60; H01L 23/00; H01L 24/48; H01L 24/85; H01L 2224/789; B23K 20/004; B23K 20/10; B23K 2101/40; B23K 2101/42; B23K 20/005; B23K 20/007
USPC ................................. 228/4.5, 180.5, 904
See application file for complete search history.

(56) References Cited

U.S. PATENT DOCUMENTS 5,156,320 A * 10/1992 Yanagida ............... H01L 24/78
228/180.5
7,654,207 B1   2/2010 Shoji et al.

FOREIGN PATENT DOCUMENTS

| | | | | |
|---|---|---|---|---|
| EP | 4324586 A2 * | 2/2024 | ............ | B23K 20/10 |
| JP | H02148749 | 6/1990 | | |
| JP | H05299461 | 11/1993 | | |
| JP | 3537890 | 6/2004 | | |
| JP | 2004228597 | 8/2004 | | |
| JP | 2008140983 | 6/2008 | | |
| JP | 4314313 B1 * | 8/2009 | ........... | B23K 20/007 |
| JP | 4425319 B1 * | 3/2010 | ........... | B23K 20/005 |
| WO | WO-2010113703 A1 * | 10/2010 | ............ | B23K 20/005 |
| WO | WO-2017217385 A1 * | 12/2017 | ............ | B06B 1/0246 |
| WO | WO-2018168888 A1 * | 9/2018 | ....... | H01L 21/67138 |

OTHER PUBLICATIONS

"Office Action of Taiwan Counterpart Application", issued on Jan. 19, 2023, with partial English translation thereof, p. 1-p. 8.

* cited by examiner

WIRE BONDING APPARATUS

CROSS-REFERENCE TO RELATED APPLICATION

This application is a 371 application of the International PCT application serial no. PCT/JP2021/006549, filed on Feb. 22, 2021. The entirety of the above-mentioned patent application is hereby incorporated by reference herein and made a part of this specification.

TECHNICAL FIELD

The invention relates to a structure of a wire bonding apparatus.

RELATED ART

A wire bonding apparatus is used to connect, by using a wire, an electrode of a semiconductor die and an electrode of a substrate.

In such wire bonding apparatus, a bonding stage on which a bonding target is mounted and an XY driving mechanism driving, in the XY directions, a device installed to the upper side are arranged side by side on a stand, a bonding head driving the front end of a bonding arm in the Z direction is installed on the XY driving mechanism, the front end of the bonding arm is driven in the XYZ directions to perform bonding of a wire or bonding of a semiconductor die (see, for example, FIG. 6 of Patent Document 1).

CITATION LIST

Patent Literature

[Patent Literature 1] Japanese Patent No. 3537890

SUMMARY OF INVENTION

Technical Problem

In the conventional wire bonding apparatus, in order to prevent the XY driving mechanism or the bonding head installed on the XY driving mechanism from interfering with the bonding stage, it is necessary to arrange the XY driving mechanism and the bonding head to be away from the bonding stage. Therefore, the gravity center position of the bonding head is away from the thrust center position of the XY driving mechanism, and the vibration of the bonding head may increase when the XY driving mechanism drives the bonding head, and the bonding quality may be deteriorated. In addition, when the bonding speed is increased, the vibration increases, and an issue that the bonding speed cannot be increased arises.

Therefore, an objective of the invention is to reduce the vibration of the wire bonding apparatus and facilitate the bonding speed.

Solution to Problem

A wire bonding apparatus according to the invention includes: a bonding stage, in which a bonding target is mounted on a mounting surface; a bonding head, to which a bonding arm is installed; an XY driving mechanism, driving the bonding head in a Y direction, which is a longitudinal direction of the bonding arm, and in an X direction, which is a front-rear direction orthogonal to the Y direction in a horizontal plane; and a frame, supporting the XY driving mechanism. The XY driving mechanism includes: an X-direction guide installed to the frame; an X-direction slider, which is supported by the X-direction guide in an upper-lower direction and guided in the X direction to move in the X direction, and in which an X-direction mover of an X-direction motor is installed to an upper side; a Y-direction guide installed to a lower side of the X-direction slider; and a Y-direction slider, which is supported by the Y-direction guide in the upper-lower direction and guided in the Y direction to move in the Y direction, and to which the bonding head is installed. The XY driving mechanism is above the mounting surface of the bonding stage and behind the bonding stage in the Y direction, and the XY driving mechanism is installed to the frame, so that when viewed in a top perspective, a portion of the Y-direction guide at front is overlapped with the mounting surface of the bonding stage.

In this way, since the XY driving mechanism is installed so that a portion of the Y-direction guide at the front is overlapped with the mounting surface of the bonding stage, the position of the X-direction slider where the Y-direction guide and the mover of the X-direction motor are installed can be close to the bonding stage. Accordingly, the center position of the mover of the X-direction motor which serves as the position of the thrust center of the X direction of the XY driving mechanism in the Y direction can be close to the bonding stage.

Accordingly, the maximum amount of deviation between the gravity center position of the bonding head and the center position of the mover of the X-direction motor can be smaller than that of the wire bonding apparatus of the conventional art. Therefore, the yawing moment applied to the bonding head when the XY driving mechanism drives the bonding head in the X direction can be reduced as compared to the wire bonding apparatus in the conventional art, the vibration around the vertical axis of the bonding head can be reduced, and the bonding quality can be facilitated.

In the wire bonding apparatus of the invention, a rear end of the bonding arm may be installed to be rotatable around a rotation axis extending in the X direction, the bonding arm may be installed to the bonding head so that a front end is movable in a direction toward or away from the mounting surface, and a height of the rotation axis may be same as a bonding surface of the bonding target mounted on the mounting surface of the bonding stage.

Accordingly, at the time of bonding, the front end of the bonding tool can be moved in the vertical direction with respect to the bonding surface, and the rigidity of the bonding head can be facilitated. In addition, the speed of the wire bonding apparatus can be increased.

In the wire bonding apparatus of the invention, a distance in the Y direction between a position of a gravity center of a load in the Y direction when the front end of the bonding arm is located at a center of the bonding stage in the Y direction and a position of a center of the X-direction mover in the Y direction may be less than 1/10 of a stroke of the bonding arm in the Y direction. The load is an integrated body of components moved in the X direction by the X-direction mover of the X-direction motor.

Accordingly, the gravity center position of the load and the center position of the mover of the X-direction motor are made close to each other, the vibration around the vertical axis of the bonding head when the bonding head 20 is driven in the X direction by the XY driving mechanism is reduced. As a result, the bonding quality can be facilitated, and the bonding speed can be increased.

In the wire bonding apparatus according of the invention, the position of the gravity center of the load in the Y direction when the front end of the bonding arm is located at the center of the bonding stage in the Y direction may be same as a position of the center of the X-direction mover in the Y direction or behind, in the Y direction, the position of the center of the X-direction mover in the Y direction.

Accordingly, by making the gravity center of the load in the Y direction when the front end of the bonding arm is located at the center of the bonding stage in the Y direction same as the position of the center of the X-direction mover in the Y direction, the amount of deviation between the gravity center position of the load and the center position of the mover of the X-direction motor can be minimized. Therefore, the vibration around the vertical axis of the bonding head when the bonding head is driven in the X direction by the XY driving mechanism can be further reduced to facilitate the bonding quality, and the bonding speed can be increased.

In addition, by making the position of the gravity center of the load in the Y direction when the front end of the bonding arm is located at the center of the bonding stage in the Y direction behind the position of the center of the X-direction mover in the Y direction, the vibration around the vertical axis of the bonding head when the front end of the bonding arm is located in the vicinity of the front end of the bonding stage can be reduced, and the bonding quality can be facilitated.

In the wire bonding apparatus of the invention, the load may be formed by the Y-direction guide, the Y-direction slider, the bonding head, and the bonding arm.

In the wire bonding apparatus of the invention, an image capturing device and a lens barrel guiding a light beam from the bonding target to the image capturing device may be installed to the bonding head, and the load may be formed by the Y-direction guide, the Y-direction slider, the bonding head, the bonding arm, the image capturing device, and the lens barrel.

In the wire bonding apparatus of the invention, the Y-direction slider may move in the Y-direction above the mounting surface of the bonding stage, the bonding arm may be installed to the bonding head to extend forward in the Y direction from the bonding head, and the bonding head may be installed to a lower side of the Y-direction slider, so that the bonding arm is moved in the Y direction above the mounting surface of the bonding stage.

In the wire bonding apparatus of the invention, the rear end part of the bonding arm may be rotatably installed to the bonding head by a cross-shaped leaf spring in which two spring plates intersect in a cross shape, and the rotation axis may be an axis along a line along which the two spring plates intersect.

Since the bonding arm is rotationally supported around the rotation axis by the cross-shaped leaf spring, there is no friction resistance such as rotational bearing, and substantially no resistance to rotation is generated. Therefore, it is possible to apply a small bonding load to the wire, the bonding article, and the bonding accuracy can be facilitated.

Effects of Invention

The wire bonding apparatus of the invention is capable of reducing the vibration of the wire bonding apparatus and facilitating the bonding speed.

DESCRIPTION OF EMBODIMENTS

Figure 1:
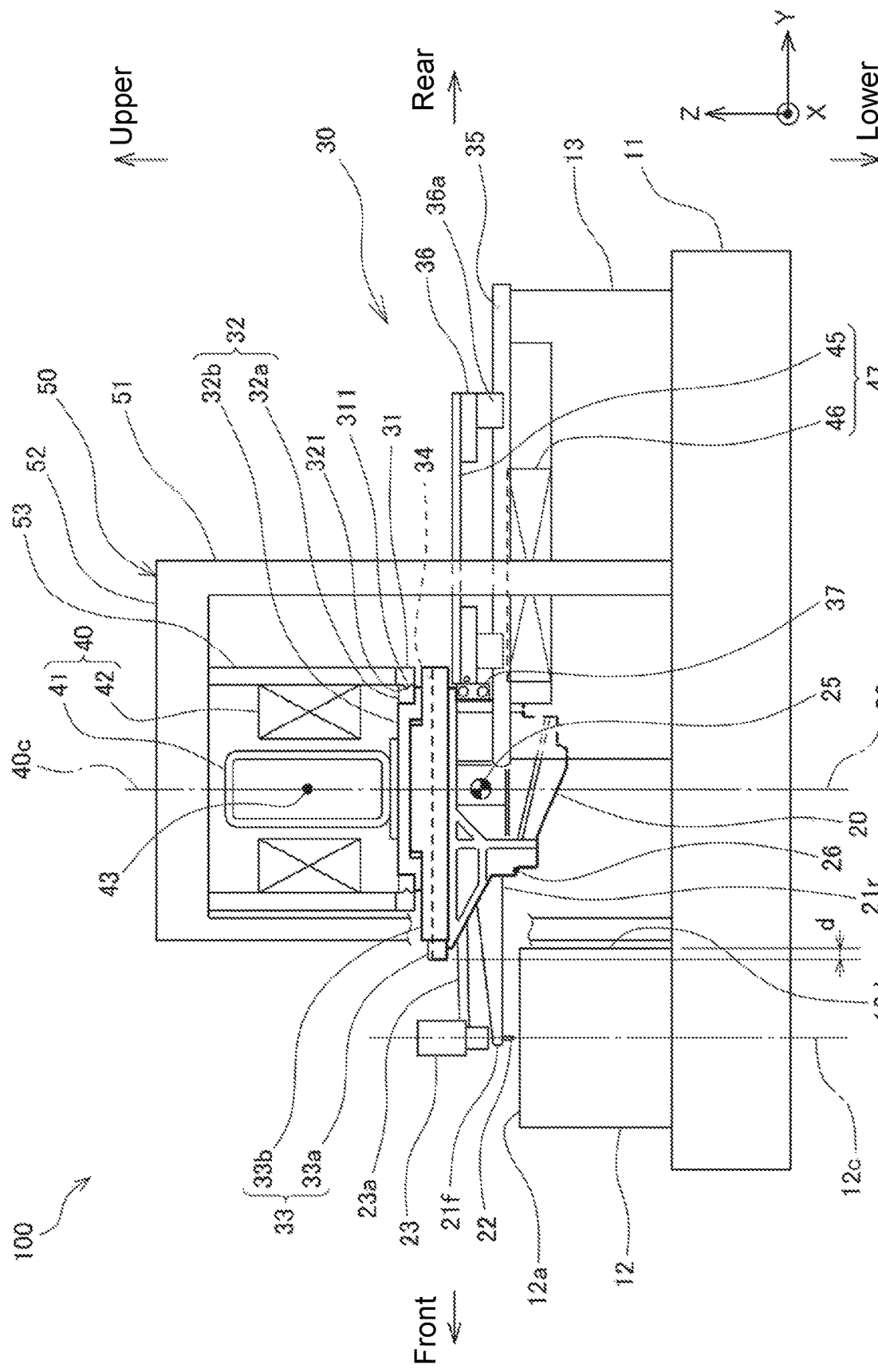
FIG. 1 is a side view illustrating a wire bonding apparatus according to an embodiment, and is a diagram illustrating a state in which the front end of a bonding arm is located at the center of a bonding stage in the Y direction.

In the following, a wire bonding apparatus 100 of the embodiment is described with reference to the drawings. In the following description, the wire bonding apparatus 100 is described as a wire bonding apparatus for connecting, by using a wire, an electrode of a semiconductor die and an electrode of a substrate. As shown in FIG. 1, a wire bonding apparatus 100 includes a stand 11, a bonding stage 12, a frame 50, an XY driving mechanism 30, a bonding head 20, a bonding arm 21, and a lens barrel 23. In the following description, as shown in FIG. 1, the longitudinal direction of the bonding arm 21 from the bonding stage 12 toward the bonding head 20 is set as the Y direction, which is the front-rear direction, and the direction orthogonal to the Y direction in a horizontal plane is set as the X direction, which is a conveyance direction of the bonding target, and the upper-lower direction is set as the Z direction. In addition, the negative side of the Y direction which faces toward the bonding stage 12 is set as "front", the positive side of the Y direction opposite thereto is set as "rear", the positive side of the X direction is set as the conveyance direction, the positive side of the Z direction is set as "upper", and the negative side of the Z direction is set as "lower".

The stand 11 is fixed to a base of the wire bonding apparatus 100 not shown herein. The bonding stage 12 is installed to the upper side at the front of the stand 11. The upper surface of the bonding stage 12 is a mounting surface 12a on which a bonding target, such as a substrate, a semiconductor die, is mounted. In addition, the bonding target, such as a substrate, is conveyed, by a conveyance apparatus not shown herein, on the mounting surface toward the positive side of the X direction.

The frame 50 is a support structure installed to the upper surface of the stand 11 and suspending the XY driving mechanism 30 from the top. The frame 50 is formed by pillars 51 fixed onto the stand 11, a beam 52 connecting the pillars 51, and two support arms 53 extending downward from the beam 52, X-direction guides 31 of the XY driving mechanism 30 being installed to the lower ends thereof.

The XY driving mechanism 30 is suspended from and supported by the frame 50 to drive the bonding head 20 installed to the lower side in the XY directions. The XY driving mechanism 30 includes the X-direction guides 31, an X-direction slider 32, a Y-direction guide 33, Y-direction sliders 34, an X-direction motor 40, and a Y-direction motor 47.

The X-direction guides 31 are square, rod-shaped members respectively installed to the lower ends of the two support arms 53 of the frame 50 and extending in the X direction, and are provided, on the side surfaces, ridge sections 311 having a ridge cross-section and extending in the longitudinal direction.

The X-direction slider 32 is formed by two X-direction slide members 32a and an X-direction slide plate 32b. Each of the X-direction slide members 32a is a square, rod-shaped member extending in the X direction, and is provided, on the side surface, a receiving groove 321. The receiving groove 321 extends in the longitudinal direction and has a V-shape groove into which the ridge part 311 of the X-direction guide 31 is fit. The X-direction slide plate 32b is a plate-shaped member connecting the two X-direction slide members 32a, and is provided with flange parts on the side ends. The X-direction slide members 32a are installed to the upper side of the flange parts. The two X-direction slide members 32a are fixed by being fastened, by bolts, onto the respective flange parts of the two side ends. When the ridge parts 311 of the X-direction guides 31 are fit into the receiving grooves 321 of the X-direction slide members 32a of the X-direction slider 32, the X-direction slider 32 is supported by the X-direction guides 31 in the upper-lower direction and guided by the X-direction guides 31 to move in the X direction.

An X-direction mover 41 forming the X-direction motor 40 is installed on the upper side of the X-direction slide plate 32b of the X-direction slider 32. In addition, X-direction stators 42 are respectively fixed to the sides of the respective support arms 53 of the frame 50 with respect to the X-direction mover 41 to face the X-direction mover 41. The X-direction mover 41 and the X-direction stators 42 form the X-direction motor 40 driving the X-direction slider 32 in the X direction. In addition, a center 43 of the X-direction mover 41 serves as the thrust center of the X-direction motor 40 in the X direction.

Figure 2:
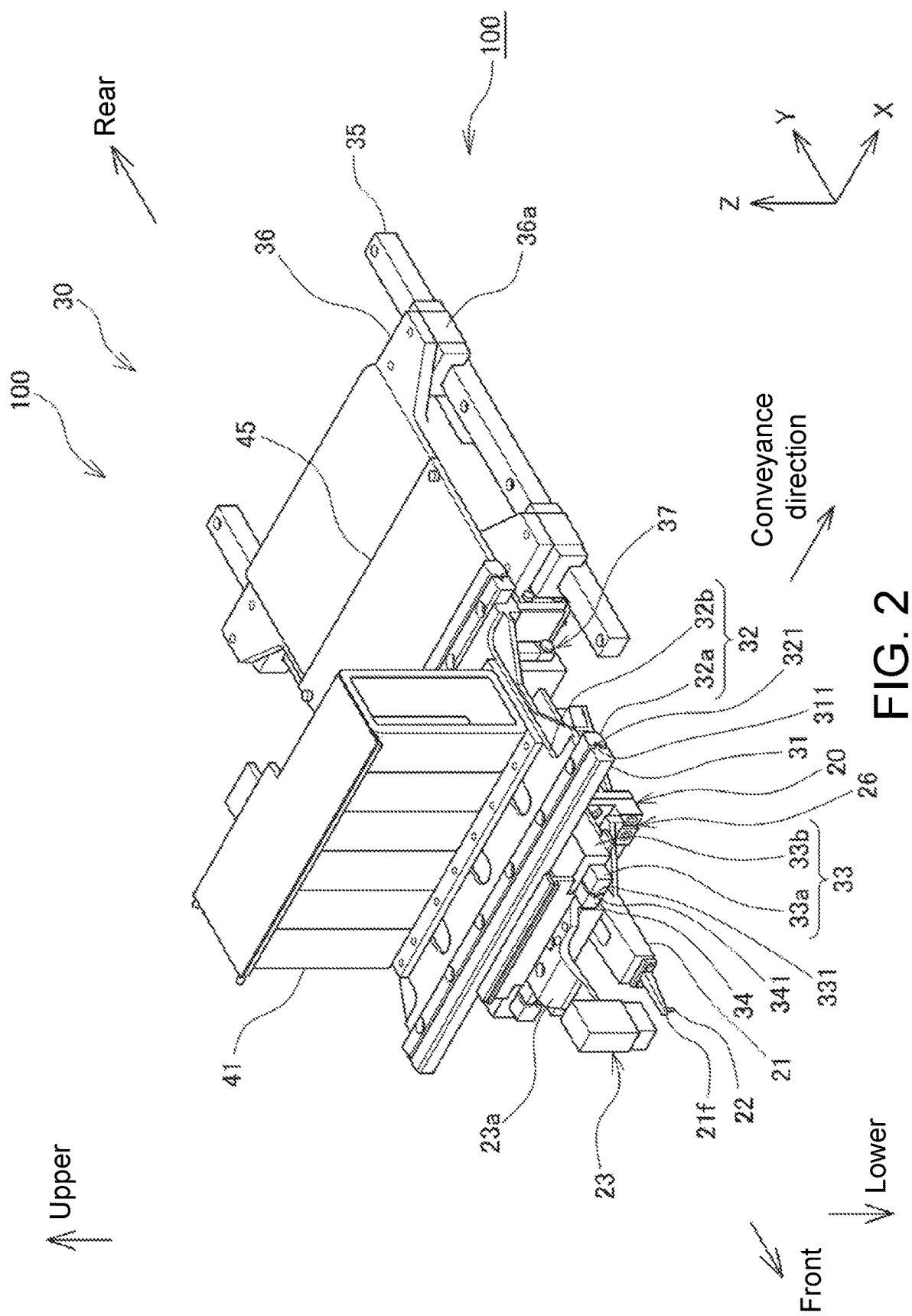
FIG. 2 is a perspective view illustrating an XY driving mechanism, a bonding head installed to the XY driving mechanism, and a bonding arm and a lens barrel installed to the bonding head.

As shown in FIG. 2, the Y-direction guide 33 includes two Y-direction guide members 33a and a Y-direction guide frame 33b to which the two Y-direction guide members 33a are installed. The Y-direction guide frame 33b is a member open on the lower side, extending in the Y direction, and having a groove-shaped cross-section, and a convex part on the upper side is installed to the lower side of the X-direction slide plate 32b of the X-direction slider 32.

The Y-direction guide members 33a are square, rod-shaped members extending in the Y direction, and provided, on the side surface, ridge parts 331 having ridge-shaped cross-sections and extending in the longitudinal direction. The two Y-direction guide members 33a are respectively fixed, by bolts, to the two side ends on the lower side of the Y-direction guide frame 33b, so that the respective ridge parts 331 face each other. The end surfaces of the Y-direction guide members 33a at the front in the Y direction are slightly more protrusive forward in the Y direction than the end surface of the Y-direction guide frame 33b at the front in the Y direction. In addition, the end surfaces of the Y-direction guide members 33a at the front in the Y direction protrude forward in the Y direction by a distance d from a rear end surface 12d of the mounting surface 12a of the bonding stage 12 in the Y direction.

Accordingly, the Y-direction guide 33 is installed to the lower side of the X-direction slide plate 32b so that, when viewed in a top perspective, a portion thereof at the front is overlapped with the mounting surface 12a of the bonding stage 12 by d. In addition, the X-direction slide plate 32b is installed to the frame 50 via the X-direction guide 31. Accordingly, the Y-direction guide 33 is installed to the frame 50 so that, when viewed from the top perspective, a portion thereof at the front in the Y direction is overlapped with the mounting surface 12a of the bonding stage 12.

Figure 3:
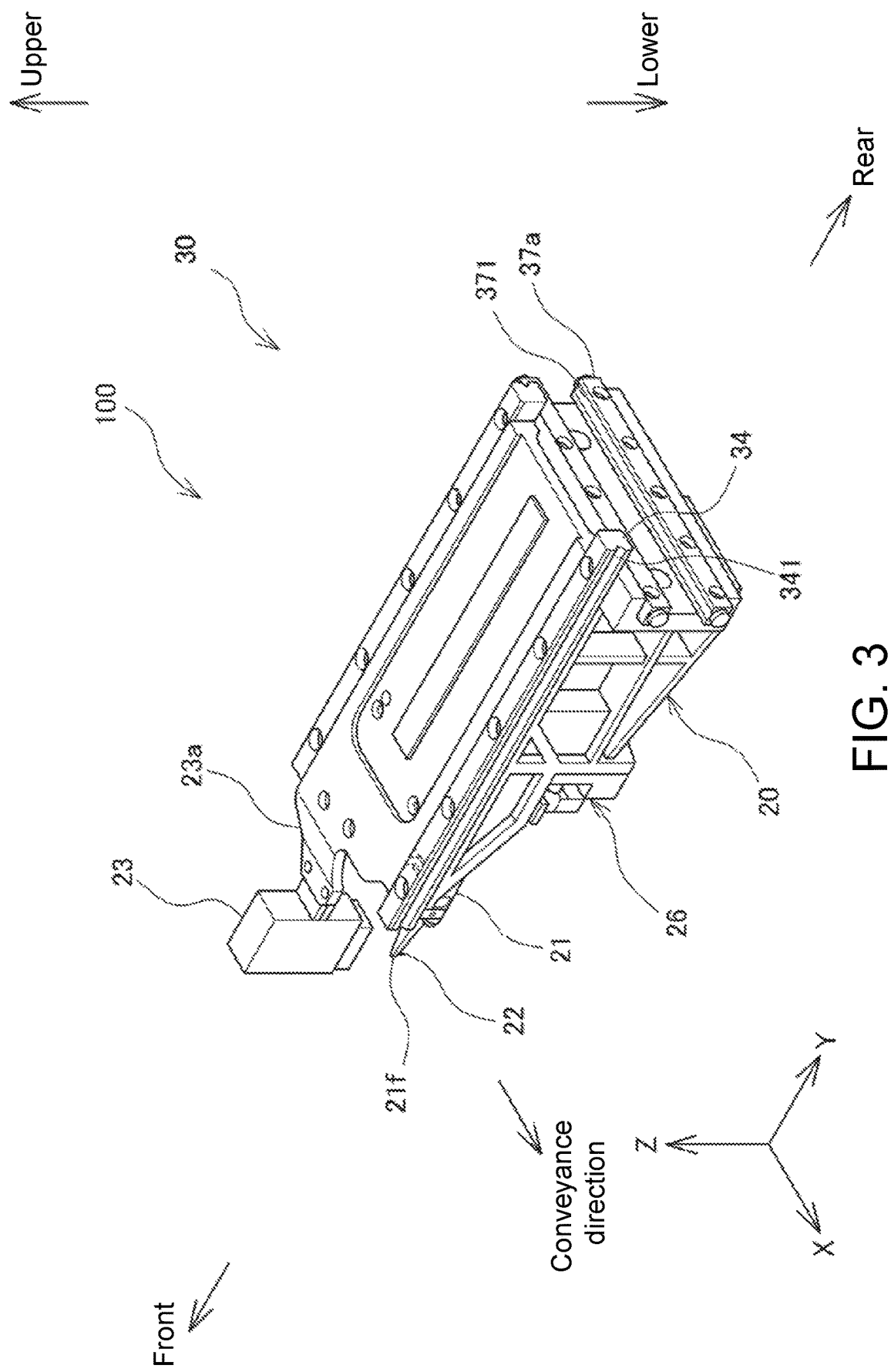
FIG. 3 is a perspective view illustrating a Y-direction slider of the XY driving mechanism and a bonding head installed to the Y-direction slider.

As shown in FIG. 3, the Y-direction sliders 34 are square, rod-shaped members extending in the Y direction and provided with receiving grooves 341 on the side surfaces. The receiving grooves 341 are V-shaped grooves which extend in the longitudinal direction and into which the ridge parts 331 of the Y-direction guide members 33a are fit. As shown in FIG. 3, the Y-direction sliders 34 are fixed, by bolts, to two side surfaces of the Y direction at the upper end of the bonding head 20, so that the receiving grooves 341 serve as the outer sides. Accordingly, as shown in FIG. 2, when the Y-direction sliders 34 and the Y-direction guide 33 are assembled so that the ridge parts 331 of the Y-direction guide members 33a of the Y-direction guide 33 are fit into the receiving grooves 341 of the Y-direction sliders 34, the Y-direction sliders 34 are supported by the Y-direction guide 33 in the upper-lower direction and move in the Y direction. In addition, the bonding head 20 installed to the Y-direction sliders 34 are supported, together with the Y-direction sliders 34, by the Y-direction guide 33, and moves in the Y direction.

Referring to FIG. 1 again, on the rear side of the bonding head 20, a Y-direction motor support stage 13, a Y-direction stator 46, a Y-direction mover 45, and a Y-direction mover base 36 are provided. The Y-direction motor support stage 13 is a support structure fixed to the stand 11, and the Y-direction stator 46 is installed to the upper side at the central part. In addition, guide rails 35 which guide sliders 36a of the Y-direction mover base 36 are installed to the upper end of the Y-direction motor support stage 13 on the front end side and the rear end side in the Y direction. The Y-direction mover 45 is installed to the Y-direction mover base 36 to face the Y-direction stator 46. In addition, the Y-direction mover base 36 and the rear end of the bonding head 20 are connected by a linear guide 37. A cross roller guide, a needle guide, for example, can be used in the linear guide 37.

Figure 4:
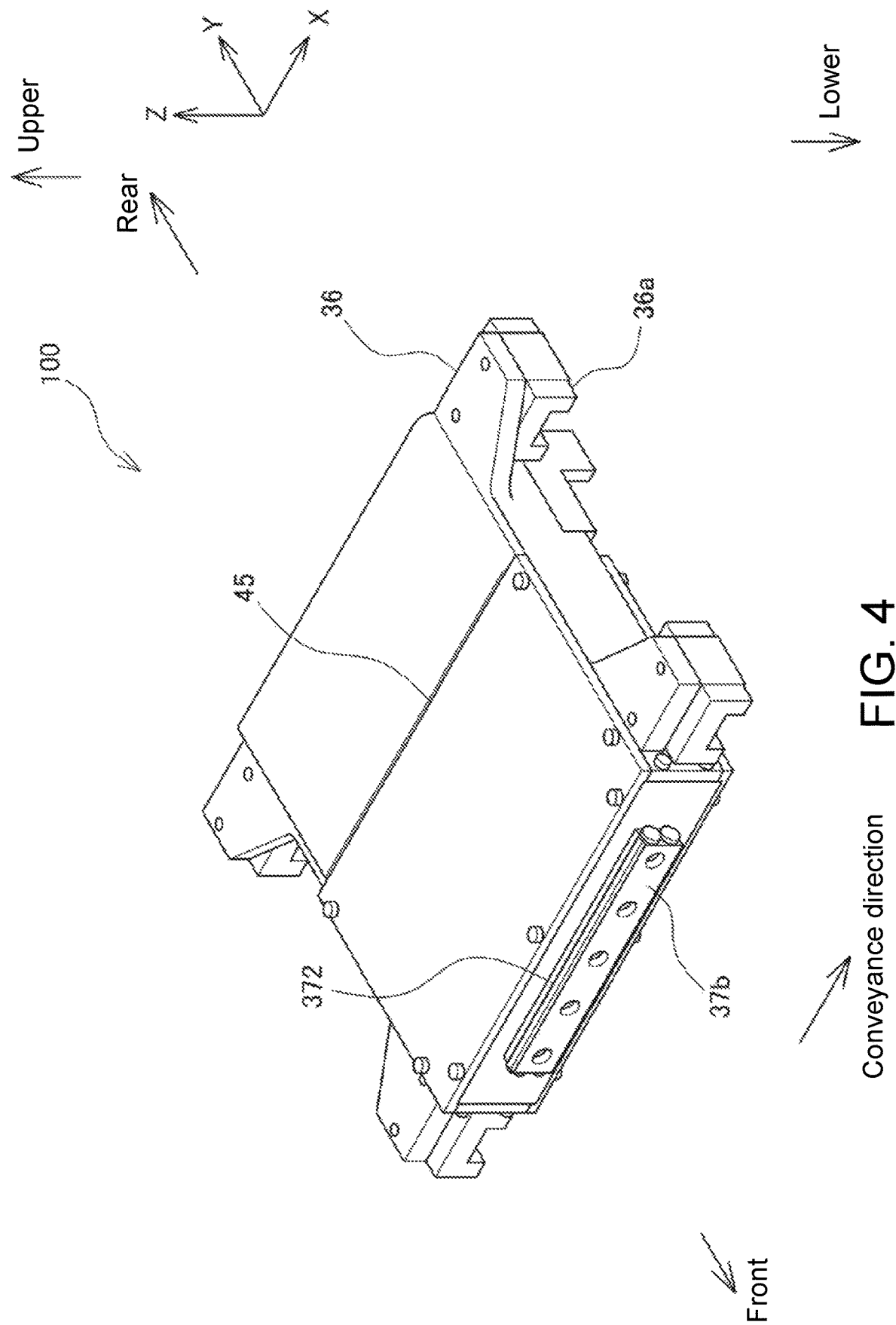
FIG. 4 is a perspective view illustrating a Y-direction mover of the XY driving mechanism and a slide mechanism of the Y-direction mover.

The linear guide 37 is formed by two, that is, upper and lower, driven side guides 37a installed to the rear end of the bonding head 20, as shown in FIG. 3, and a driving side guide 37b fixed to the front end of the Y-direction mover base 36 in the Y direction, as shown in FIG. 4. The driving side guide 37b is a rod-shaped longitudinal member, and provided with ridge parts 372 having ridge-shaped cross-sections on the upper and lower surfaces. The driven side guides 37a are pillar-shaped longitudinal members, and V-shaped receiving grooves 371 into which the ridge parts 372 of the driving side guide 37b are fit are provided on the upper surface or the lower surface.

Figure 5:
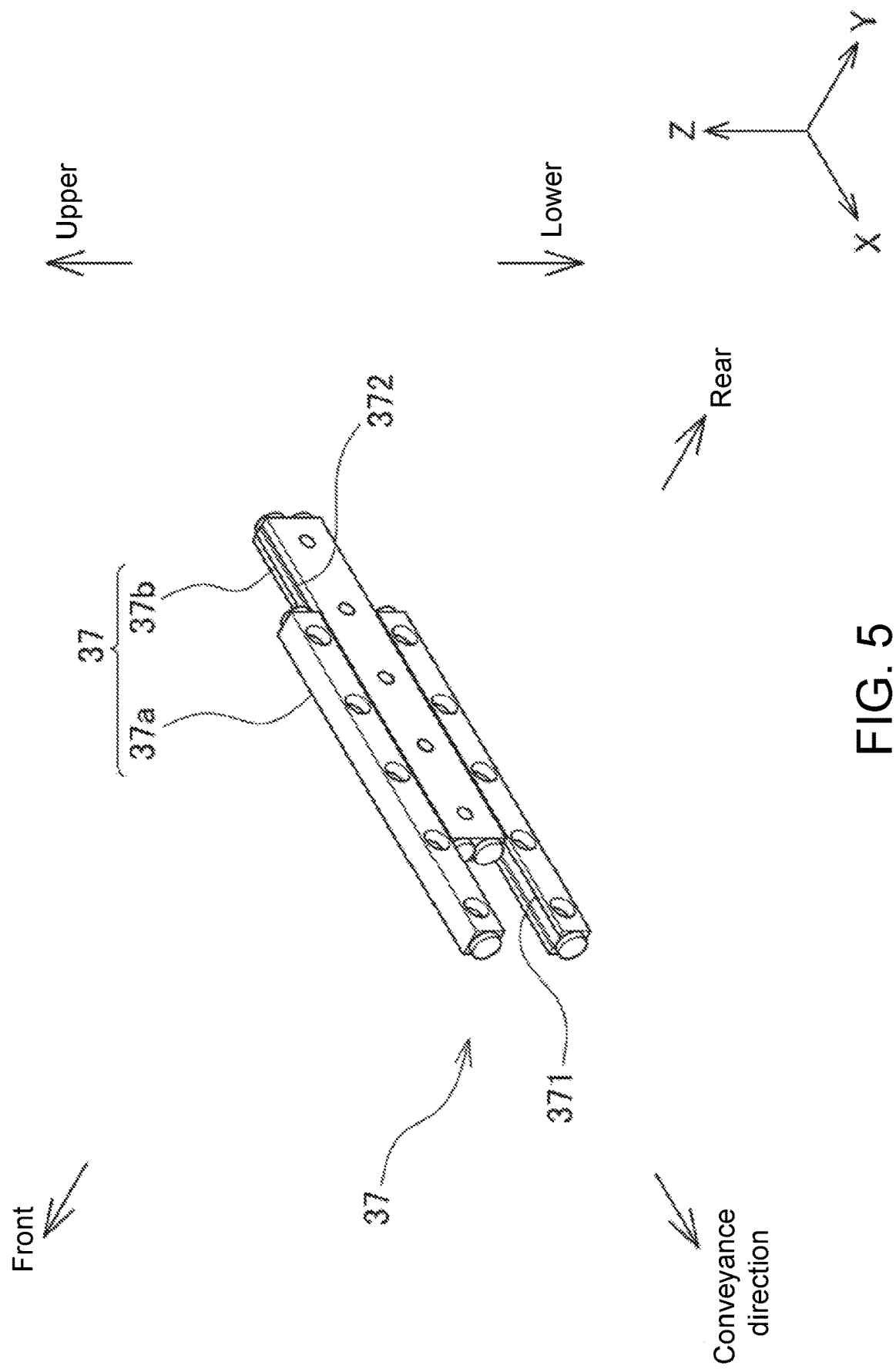
FIG. 5 is a perspective view illustrating a cross roller guide connecting the Y-direction slider and a Y-direction mover base of the XY driving mechanism.

When the driving side guide 37b and the driven side guides 37a are assembled so that the ridge parts 372 of the driving side guide 37b and the receiving grooves 371 of the driven side guides 37a are engaged, as shown in FIG. 5, the driven side 37a follows the movement of the driving side guide 37b in the Y direction to move in the Y direction, while sliding in the X direction with respect to the driving side guide 37b. Therefore, when the Y-direction mover base 36 is moved in the Y direction by the Y-direction mover 45, the driven side guide 37a drives the connected bonding head 20 to move in the Y direction, while moving in the X direction. Accordingly, the bonding head 20 is driven in the XY directions by the X-direction mover 41 of the X-direction motor 40 and the Y-direction mover 45 of the Y-direction motor 47.

As described above, the X-direction guides 31, the X-direction slider 32, the Y-direction guide 33, and the Y-direction sliders 34 forming the XY driving mechanism 30 is installed to the frame 50 so as to be located on the rear side of the bonding stage 12 in the Y direction above the mounting surface 12 of the bonding stage 12.

Figure 6:
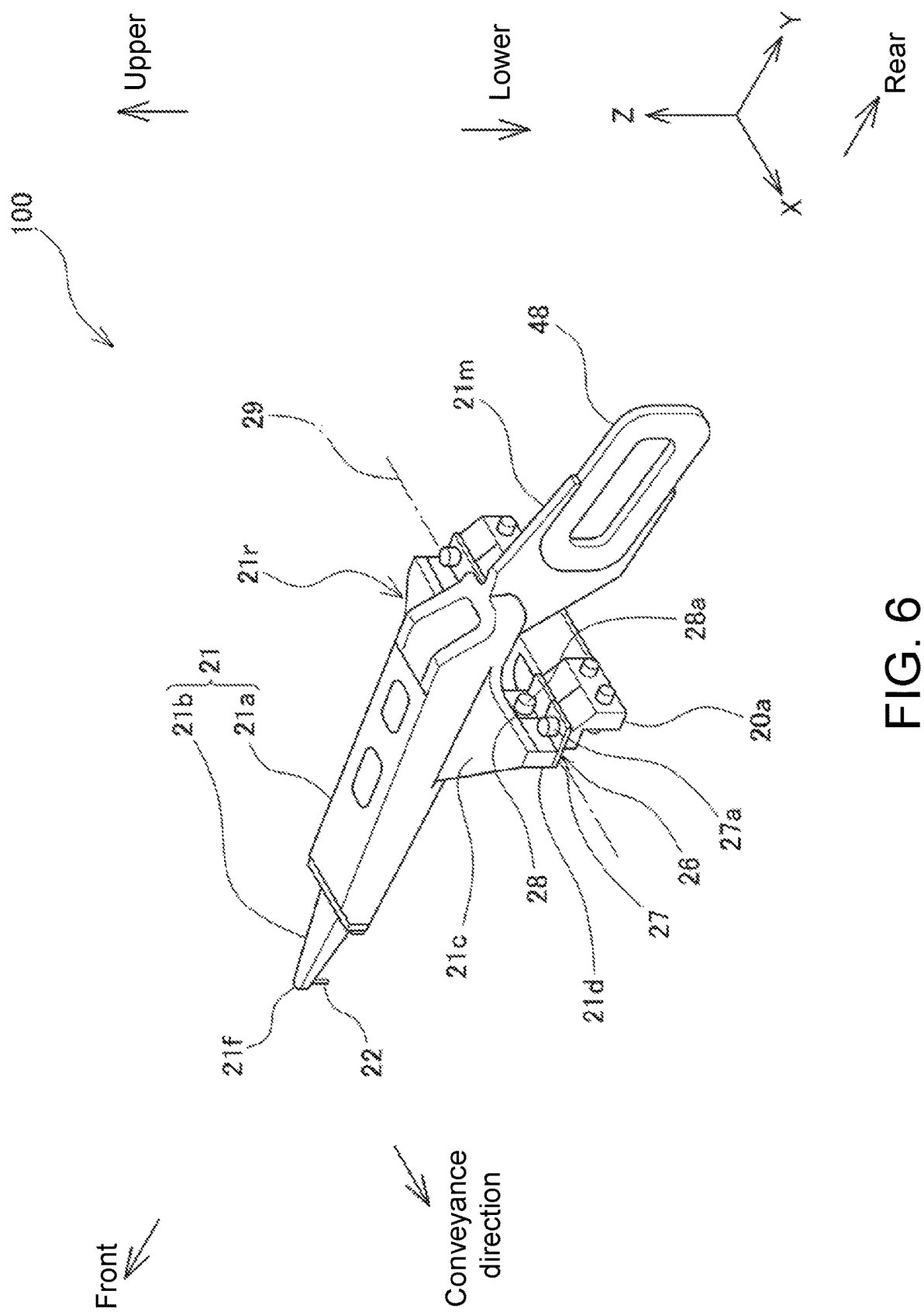
FIG. 6 is a perspective view illustrating the bonding arm of the wire bonding apparatus shown in FIG. 1.

As shown in FIG. 6, the bonding arm 21 is formed by a body 21a, and an ultrasonic horn 21b installed to the front of the body 21a in the Y direction. A capillary 22, which is a bonding tool, is installed to a front end 21f of the ultrasonic horn 21b. An opening to which an ultrasonic vibrator is installed is provided at the center of the body 21a in the longitudinal direction.

In a rear end part 21r of the body 21a, a spreading triangular installation rib 21c is provided on each of the positive side and the negative side of the X direction. An installation seat 21d for installation of a cross-shaped leaf spring 26 is provided at the rear end of the installation rib 21c, and the rear end part 21r of the bonding arm 21 is installed to a structure member 20a at the front of the bonding head 20 in the Y direction by the cross-shaped leaf spring 26 installed to the installation seat 21d. In addition, a plate-shaped Z-direction mover installation plate 21m of a Z-direction motor extends rearward in the Y direction from the rear end part 21r of the body 21a. A Z-direction mover 48 is installed to the Z-direction mover installation plate 21m. The Z-direction mover installation plate 21m and the Z-direction mover 48 are accommodated inside the bonding head 20.

Figure 7:
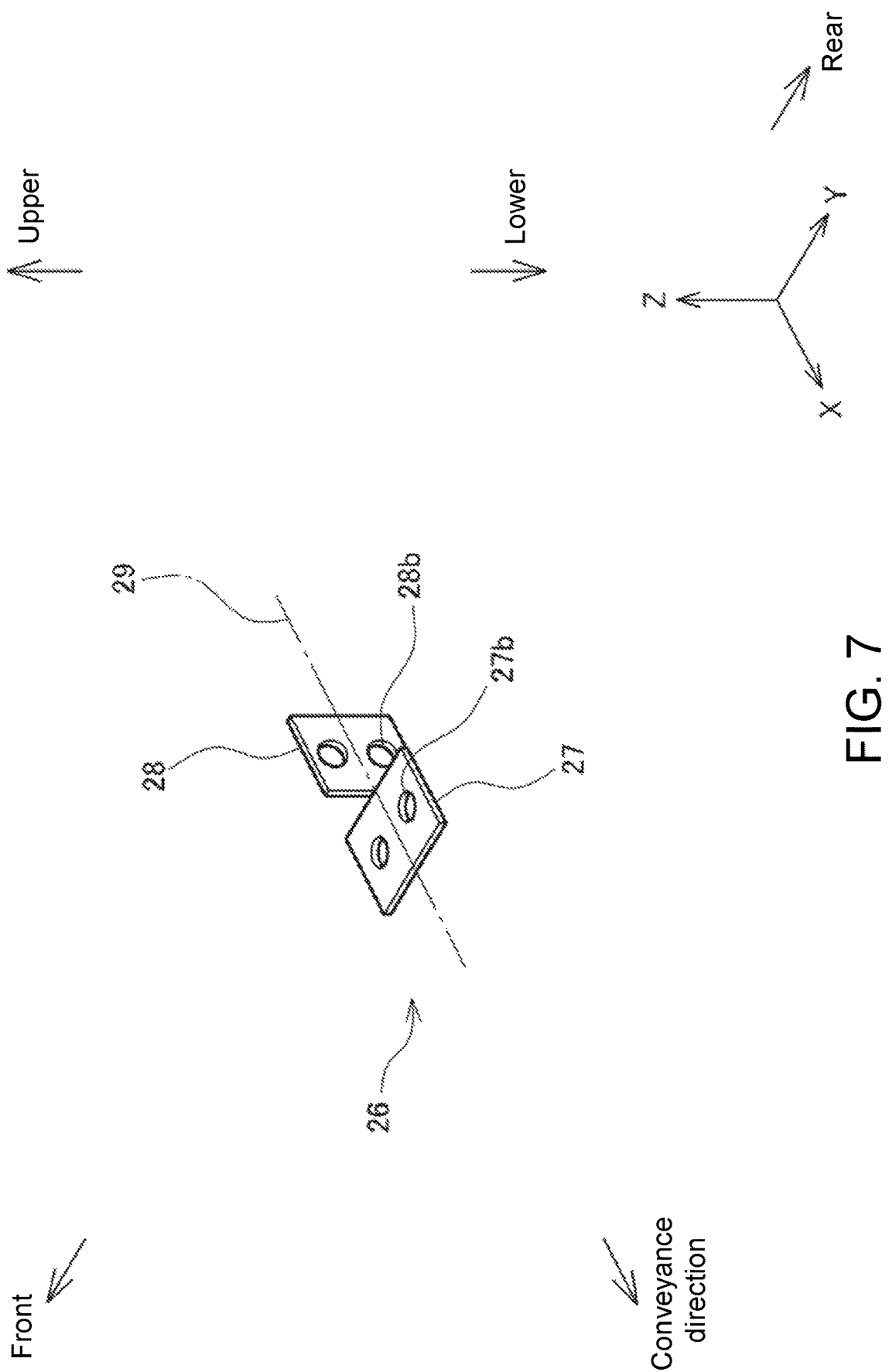
FIG. 7 is a perspective view illustrating the configuration of a cross-shaped leaf spring installing the bonding arm to the bonding head.

As shown in FIG. 7, the cross-shaped leaf spring 26 is assembled so that a horizontal spring plate 27 and a vertical spring plate 28 on which bolt holes 27b and 28b are provided intersect in a cross shape. As shown in FIG. 6, the rear end (positive side in Y direction) of the horizontal spring plate 27 is fixed, by a bolt 27a, to the structure member 20a of the bonding head 20, and the front end (negative side in Y direction) is fixed, by a bolt, to the lower surface of the installation seat 21d of the bonding arm 21. In addition, the upper end of the vertical spring plate 28 is fixed, by a bolt 28a, to the vertical surface on the rear end of the installation seat 21d of the bonding arm 21, and the lower end is fixed, by a bolt, to the structure member 20a of the bonding head 20. In addition, a line along which the horizontal spring plate 27 and the vertical spring plate 28 intersect and which extends in the X direction is a rotation axis 29 of the bonding arm 21, and the cross-shaped leaf spring 26 rotatably supports the bonding arm 21 around the rotation axis 29.

Accordingly, the rear end part 21r of the bonding arm 21 is rotatably installed around the rotation axis 29 extending in the X direction. In addition, Z-direction stators not shown herein are installed on two sides of the Z-direction mover 48 accommodated inside the bonding head 20. The Z-direction stators drive the Z-direction mover 48 to rotate around the rotation axis 29, and drive in a direction in which the lower end of the capillary 22 installed to the front end 21f of the ultrasonic horn 21b moves toward or away from the mounting surface 12a of the bonding stage 12.

The bonding arm 21 is installed to the bonding head 20, so that the height of the rotation axis 29 is the same as the bonding surface of the bonding target mounted on the mounting surface 12a of the bonding stage 12. Therefore, the lower end of the capillary 22 moves toward or away from the bonding surface of the bonding target in a vertical direction.

Accordingly, the bonding arm 21 extends forward in the Y direction from the bonding head 20, and is installed to the bonding head 20 so as to move in the Y direction above the mounting surface 12a of the bonding stage 12.

The lens barrel 23 is an optical member guiding a light beam from the bonding target mounted on the mounting surface 12a of the bonding stage 12 to an image capturing device installed inside the bonding head 20. The lens barrel 23 is installed to the front end of an installation arm 23a extending forward in the Y direction and installed to the bonding head 20, and the lens barrel 23 is provided above the front end 21f of the bonding arm 21. In addition, the image capturing device (not shown) obtaining the light beam, as an image, from the bonding target from the lens barrel 23 is installed in the bonding head 20.

In the wire bonding apparatus 100 with the above configuration, when the Y-direction mover 45 moves in the Y direction, the bonding head 20 connected to the Y-direction mover 45 and the Y-direction sliders 34 installed to the bonding head 20 move in the Y direction. In addition, when the X-direction mover 41 moves in the X direction, the Y-direction guide 33 installed to the lower side of the X-direction slider 32, the Y-direction sliders 34 supported by the Y-direction guide 33 in the upper-lower direction and moving in the Y direction, and the bonding head 20 installed to the Y-direction sliders 34 move integrally in the X direction. Accordingly, the XY driving mechanism 30 drives the bonding head 20 in the XY directions.

Here, when the X-direction mover 41 moves in the X direction, the Y-direction guide 33, the Y-direction sliders 34, the bonding head 20, the bonding arm 21 installed to the bonding head 20, the lens barrel 23, and the image capturing device moving with the X-direction mover 41 in the X direction form a load that is an integrated body of components moved in the X direction by the X-direction mover 41. In FIG. 1, a gravity center mark indicates a gravity center position 25 of the load as a whole. In addition, a dot-chain line 20c is a line passing through the gravity center position 25 of the load and extending in the upper-lower direction. In addition, in FIGS. 1, 8, and 9, a dot-chain line 40c is a line passing through the center 43 of the X-direction mover 41, which is the thrust center of the X-direction motor 40 in the X direction, and extending in the upper-lower direction, and a dot-chain line 12c is a line passing through the center of the bonding stage 12 in the Y direction and extending in the upper-lower direction.

As shown in FIG. 1, the front end 21f of the bonding arm 21 is located at the center of the bonding stage 12 in the Y direction. That is, as shown in FIG. 1, when the center of the capillary 22 is at the position of the dot-chain line 12c, the position of the gravity center position 25 of the load in the Y direction is substantially the same as the position of the center 43 of the X-direction mover 41 in the Y direction.

Figure 8:
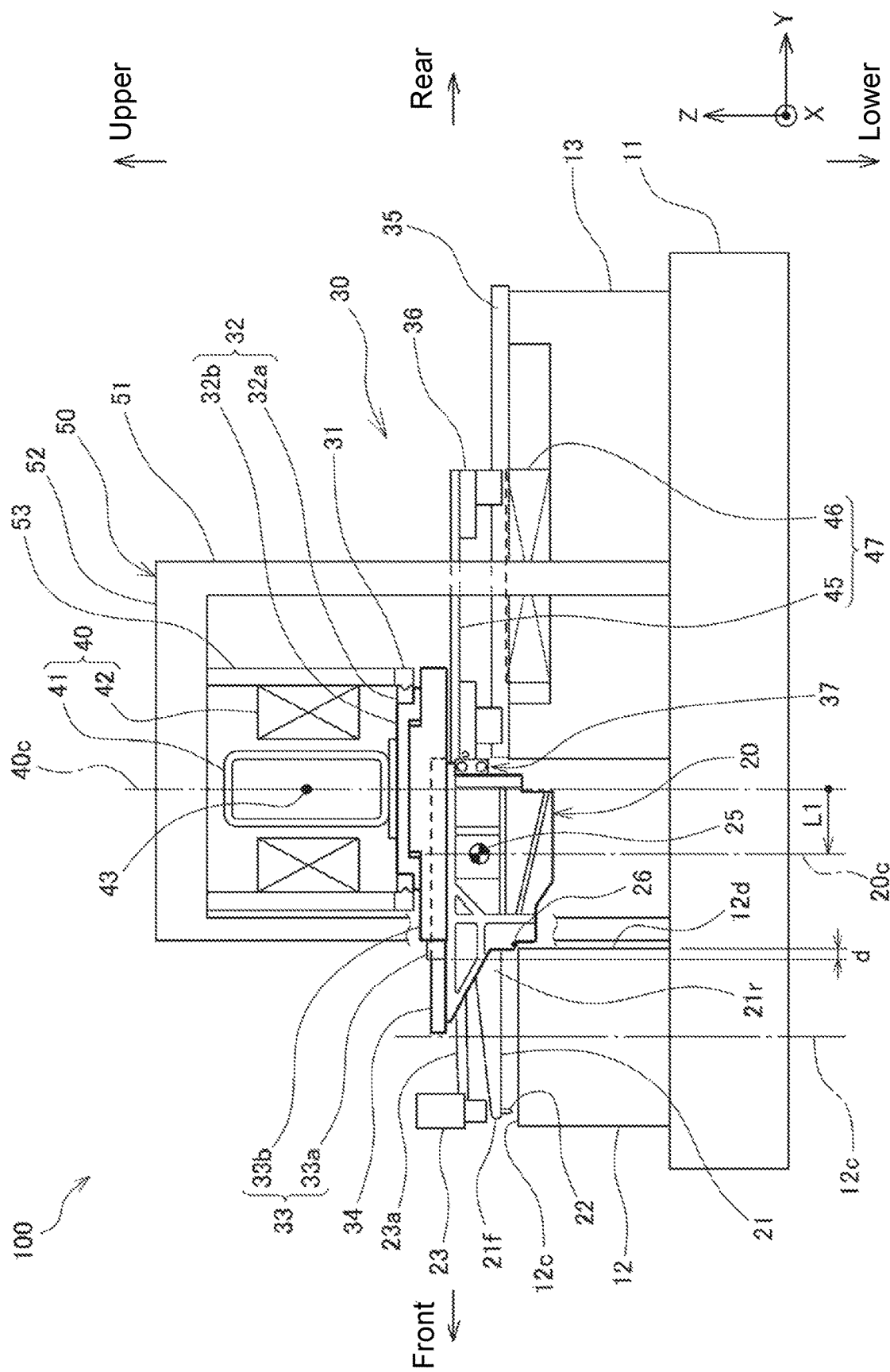
FIG. 8 is a side view illustrating the wire bonding apparatus shown in FIG. 1, and is a diagram illustrating a state in which the front end of the bonding arm is located in a vicinity of the front end of the bonding stage.

In addition, as shown in FIG. 8, when the bonding head 20 moves from the position indicated in FIG. 1 toward the negative side of the Y direction by a distance L1, and the front end 21f of the bonding arm 21 moves to the vicinity of the front end of the bonding stage 12, the Y-direction sliders 34 move in the Y direction above the mounting surface 12a of the bonding stage 12, and the bonding arm 21 moves in the Y direction above the mounting surface 12a of the bonding stage 12. In addition, the position of the gravity center position 25 of the load in the Y direction is deviated forward in the Y direction by the distance L1 with respect to the position of the center 43 of the X-direction mover 41 in the Y direction.

Figure 9:
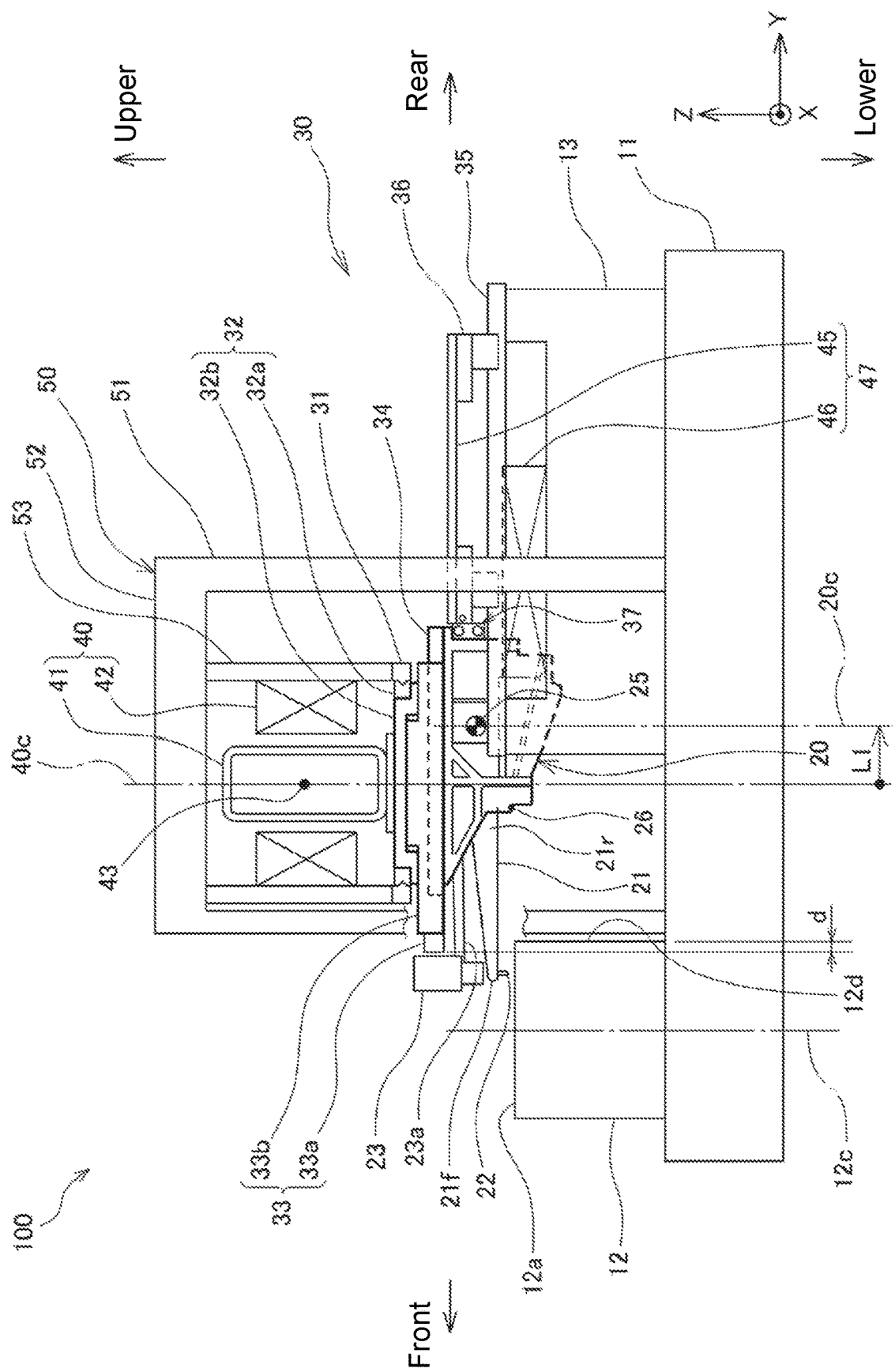
FIG. 9 is a side view illustrating the wire bonding apparatus shown in FIG. 1, and is a diagram illustrating a state in which the front end of the bonding arm is located in a vicinity of the rear end of the bonding stage.

Comparatively, as shown in FIG. 9, when the bonding head 20 moves from the position indicated in FIG. 1 toward the positive side of the Y direction by the distance L1, and the front end 21f of the bonding arm 21 moves to the vicinity of the rear end of the bonding stage 12, the position of the gravity center position 25 of the load in the Y direction is deviated rearward in the Y direction by the distance L1 with respect to the position of the center 43 of the X-direction mover 41 in the Y direction.

Accordingly, the amount of deviation between the position of the gravity center position 25 of the load in the Y direction and the position of the center 43 of the X-direction mover 41 in the Y direction reaches the maximum when the front end 21f of the bonding arm 21 is located at the front end or the rear end of the bonding stage 12 in the Y direction, as shown in FIGS. 8 and 9.

The wire bonding apparatus 100 according to the embodiment has a configuration as follows. The driving mechanism 30 is installed to the frame 50 so that a portion of the Y-direction guide 33 at the front is overlapped with the mounting surface 12a of the bonding stage 12, and the position of the X-direction slider 32 to which the Y-direction guide 33 and the X-direction mover 41 are installed in the Y direction is near the bonding stage 12. Accordingly, the gravity center position 25 of the load moves, in the Y direction, forward and rearward in the vicinity of the center 43 of the X-direction mover 41. Accordingly, the maximum amount of deviation between the gravity center position 25 of the load and the center 43 of the X-direction mover 41 can be smaller than that of the wire bonding apparatus of the conventional art as recited in Patent Literature 1. Therefore, the yawing moment applied to the bonding head 20 when the XY driving mechanism 30 drives the bonding head 20 in the X direction is also reduced as compared to the wire bonding apparatus in the conventional art, and the vibration around the vertical axis of the bonding head 20 can be reduced. In addition, by reducing the vibration around the vertical axis of the bonding head 20, the vibration amplitude around the vertical axis of the bonding head 20 can be reduced. In addition, by reducing the yawing moment applied to the bonding head 20, the characteristic vibration frequency around the vertical axis of the bonding head 20 is increased, and the amplitude of the vibration around the vertical axis of the bonding head 20 can be reduced.

Then, by reducing the amplitude of the vibration around the vertical axis of the bonding head, the amplitude of the vibration of the capillary 22 installed to the front end 21f of the bonding arm 21 in the X direction due to vibration can be reduced, and the bonding quality can be facilitated.

In addition, in the wire bonding apparatus 100 according to the embodiment, by making the position of the gravity center position 25 of the load in the Y direction when the front end 21f of the bonding arm 21 is located at the center of the bonding stage 12 in the Y direction same as the position of the center 43 of the X-direction mover 41 in the Y direction, the gravity center position 25 of the load is moved in the Y direction at the front and the rear of the center 43 of the X-direction mover 41. Accordingly, the distance L1 shown in FIGS. 8 and 9 becomes ½ of the stroke of the bonding head 20 in the Y direction, and the maximum amount of deviation between the gravity center position 25 of the load and the center 43 of the X-direction mover 41 can be minimized. Therefore, the yawing moment applied to the bonding head 20 when the XY driving mechanism 30 drives the bonding head 20 in the X direction can be further reduced, thereby further reducing the vibration around the vertical axis and further facilitating the bonding quality.

Moreover, in the wire bonding apparatus 100 of the embodiment, the Y-direction sliders 34 move in the Y direction above the mounting surface 12a of the bonding stage 12, the bonding arm 21 is installed to the bonding head 20 to extend forward from the bonding head 20 in the Y direction, and the bonding head 20 is installed to the lower side of the Y-direction sliders 34, so that the bonding arm 21 is moved in the Y direction above the mounting surface 12a of the bonding stage 12. Accordingly, the movement stroke of the Y direction of the front end 21f of the bonding arm 21 can be increased, and the bonding can be performed on a large substrate.

Moreover, in the wire bonding apparatus 100 of the embodiment, the bonding arm 21 is installed to the bonding head 20, so that the height of the rotation axis 29 is the same as the bonding surface of the bonding target mounted on the mounting surface of the bonding stage 12. Accordingly, at the time of bonding, the lower end of the capillary 22 can be moved with respect to the bonding surface in the vertical direction, and the bonding quality can be facilitated.

In addition, in the wire bonding apparatus 100 of the embodiment, since the bonding arm 21 is rotatably installed to the bonding head 20 by the cross-shaped leaf spring 26, there is no friction resistance such as rotational bearing, and substantially no resistance to rotation is generated. Therefore, it is possible to apply a small bonding load to the wire, the bonding article, and the bonding accuracy can be facilitated.

In the wire bonding apparatus 100 described above, the position of the gravity position 25 of the load in the Y direction when the front end 21f of the bonding arm 21 is located at the center of the bonding stage 12 in the Y direction is the same as the position of the center 43 of the X-direction mover in the Y direction. However, the invention is not limited thereto. The distance in the Y direction between the position of the gravity center position 25 of the load in the Y direction and the position of the center 43 of the X-direction mover 41 in the Y direction may also fall within a range of being less than ⅒ of the stroke of the bonding arm 21 in the Y direction. Accordingly, the gravity center position 25 of the load and the center 43 of the X-direction mover 41 are close to each other, the vibration around the vertical axis of the bonding head 20 when the bonding head 20 is driven in the X direction is reduced, thereby being able to facilitate the bonding quality and speed up the bonding.

In addition, the XY driving mechanism 30 may also be arranged, so that the position of the gravity center position 25 of the load in the Y direction when the front end 21 of the bonding arm 21 is located at the center of the bonding stage 12 in the Y direction is behind, in the Y direction, the position of the center 43 of the X-direction mover 41 in the Y direction.

The vibration around the vertical axis of the bonding head 20 when the bonding head 20 is driven in the X direction reaches the maximum in the case where, as shown in FIG. 8, the front end 21f of the bonding arm 21 is located in the vicinity of the front end of the bonding stage 12. This is because the distance between the front end 21f of the bonding arm 21 to which the capillary 22 is installed and the center 43 of the X-direction mover 41 as the thrust center of the X direction reaches the maximum. Therefore, by making the position of the XY driving mechanism 30 slightly deviated forward in the Y direction, and making the position of the gravity center position 25 of the load in the Y direction when the front end 21*f* of the bonding arm 21 is located at the center of the bonding stage 12 in the Y direction slightly behind, in the Y direction, the position of the center 43 of the X-direction mover 41 in the Y direction, the amount of deviation between the position of the gravity center position 25 of the load in the Y direction when the front end 21*f* of the bonding arm 21 is located at the vicinity of the front end of the bonding stage 12 and the position of the center 43 of the X-direction mover 41 in the Y direction can be reduced. Accordingly, the vibration around the vertical axis of the bonding head 20 when the front end of the bonding arm 21 is located in the vicinity of the front end of the bonding stage 12 can be reduced, and the bonding quality can be facilitated.

To which extent the position of the gravity center position 25 of the load in the Y direction when the front end 21*f* of the bonding arm 21 is located at the center of the bonding stage 12 in the Y direction is deviated rearward with respect to the position of the center 43 of the X-direction mover 41 in the Y direction may be set according to the mass of the bonding head 20 or the mass, the length of the bonding arm 21. For example, such rearward deviation may be set as $\frac{1}{50}$ to $\frac{1}{10}$ of the stroke of the bonding arm 21 in the Y direction.

In addition, in the wire bonding apparatus 100 of the embodiment, the Y-direction guide 33, the Y-direction sliders 34, the bonding head 20, the bonding arm 21, and the lens barrel 23 are described as forming a load that is the integrated body of components moved in the X direction by the X-direction mover 41. However, the invention is not limited thereto.

For example, in the case where an optical element, such as an optical fiber that is very light is configured to be installed to the bonding head 20 to transmit a light beam from the bonding target to the image capturing device, and the lens barrel 23 is not provided, the load may also be formed by the Y-direction guide 33, the Y-direction sliders 34, the bonding head 20, the bonding arm 21, and the image capturing device without the lens barrel 23. In the case where the image capturing device is not installed to the bonding head 20, either, the load may also be formed by the Y-direction guide 33, the Y-direction sliders 34, the bonding head 20, and the bonding arm 21, without the lens barrel 23 and the image capturing device.

What is claimed is:

1. A wire bonding apparatus, comprising:
   a bonding stage, in which a bonding target is mounted on a mounting surface;
   a bonding head, to which a bonding arm is installed;
   an XY driving mechanism, driving the bonding head in a Y direction, which is a longitudinal direction of the bonding arm, and in an X direction, which is a front-rear direction orthogonal to the Y direction in a horizontal plane; and
   a frame, supporting the XY driving mechanism,
   wherein the XY driving mechanism comprises:
     an X-direction guide installed to the frame;
     an X-direction slider, which is supported by the X-direction guide in an upper-lower direction and guided in the X direction to move in the X direction, and in which an X-direction mover of an X-direction motor is installed to an upper side;
     a Y-direction guide installed to a lower side of the X-direction slider; and
     a Y-direction slider, which is supported by the Y-direction guide in the upper-lower direction and guided in the Y direction to move in the Y direction, and to which the bonding head is installed,
   wherein the XY driving mechanism is above the mounting surface of the bonding stage and behind the bonding stage in the Y direction, and the XY driving mechanism is installed to the frame, so that when viewed in a top perspective, a portion of the Y-direction guide at front is overlapped with the mounting surface of the bonding stage,
   wherein a rear end of the bonding arm is installed to be rotatable around a rotation axis extending in the X direction, and the bonding arm is installed to the bonding head so that a front end is movable in a direction toward or away from the mounting surface, and
   a height of the rotation axis is same as a bonding surface of the bonding target mounted on the mounting surface of the bonding stage.

2. The wire bonding apparatus as claimed in claim 1, wherein a distance in the Y direction between a position of a gravity center of a load in the Y direction when the front end of the bonding arm is located at a center of the bonding stage in the Y direction and a position of a center of the X-direction mover in the Y direction is less than $\frac{1}{10}$ of a stroke of the bonding arm in the Y direction, the load being an integrated body of components moved in the X direction by the X-direction mover of the X-direction motor.

3. The wire bonding apparatus as claimed in claim 2, wherein the position of the gravity center of the load in the Y direction when the front end of the bonding arm is located at the center of the bonding stage in the Y direction is same as a position of the center of the X-direction mover in the Y direction or behind, in the Y direction, the position of the center of the X-direction mover in the Y direction.

4. The wire bonding apparatus as claimed in claim 2, wherein the load is formed by the Y-direction guide, the Y-direction slider, the bonding head, and the bonding arm.

5. The wire bonding apparatus as claimed in claim 2, wherein an image capturing device and a lens barrel guiding a light beam from the bonding target to the image capturing device are installed to the bonding head, and the load is formed by the Y-direction guide, the Y-direction slider, the bonding head, the bonding arm, the image capturing device, and the lens barrel.

6. The wire bonding apparatus as claimed in claim 1, wherein the Y-direction slider moves in the Y-direction above the mounting surface of the bonding stage,
   the bonding arm is installed to the bonding head to extend forward in the Y direction from the bonding head, and
   the bonding head is installed to a lower side of the Y-direction slider, so that the bonding arm is moved in the Y direction above the mounting surface of the bonding stage.

7. The wire bonding apparatus as claimed in claim 1, wherein the rear end part of the bonding arm is rotatably installed to the bonding head by a cross-shaped leaf spring in which two spring plates intersect in a cross shape, and the rotation axis is an axis along a line along which the two spring plates intersect.

8. The wire bonding apparatus as claimed in claim 3, wherein the load is formed by the Y-direction guide, the Y-direction slider, the bonding head, and the bonding arm.

9. The wire bonding apparatus as claimed in claim 3, wherein an image capturing device and a lens barrel guiding a light beam from the bonding target to the image capturing device are installed to the bonding head, and the load is formed by the Y-direction guide, the Y-direction slider, the bonding head, the bonding arm, the image capturing device, and the lens barrel.

10. The wire bonding apparatus as claimed in claim 2, wherein the Y-direction slider moves in the Y-direction above the mounting surface of the bonding stage,
- the bonding arm is installed to the bonding head to extend forward in the Y direction from the bonding head, and
- the bonding head is installed to a lower side of the Y-direction slider, so that the bonding arm is moved in the Y direction above the mounting surface of the bonding stage.

11. The wire bonding apparatus as claimed in claim 3, wherein the Y-direction slider moves in the Y-direction above the mounting surface of the bonding stage,
- the bonding arm is installed to the bonding head to extend forward in the Y direction from the bonding head, and
- the bonding head is installed to a lower side of the Y-direction slider, so that the bonding arm is moved in the Y direction above the mounting surface of the bonding stage.

12. The wire bonding apparatus as claimed in claim 4, wherein the Y-direction slider moves in the Y-direction above the mounting surface of the bonding stage,
- the bonding arm is installed to the bonding head to extend forward in the Y direction from the bonding head, and
- the bonding head is installed to a lower side of the Y-direction slider, so that the bonding arm is moved in the Y direction above the mounting surface of the bonding stage.

13. The wire bonding apparatus as claimed in claim 5, wherein the Y-direction slider moves in the Y-direction above the mounting surface of the bonding stage,
- the bonding arm is installed to the bonding head to extend forward in the Y direction from the bonding head, and
- the bonding head is installed to a lower side of the Y-direction slider, so that the bonding arm is moved in the Y direction above the mounting surface of the bonding stage.

* * * * *